United States Patent [19]

Scanlon et al.

[11] Patent Number: 4,849,247

[45] Date of Patent: Jul. 18, 1989

[54] ENHANCED ADHESION OF SUBSTRATE MATERIALS USING ION-BEAM IMPLANTATION

[75] Inventors: John F. Scanlon, Roscoe; William D. Sherman, Genoa, both of Ill.

[73] Assignee: Sundstrand Corporation, Rockford, Ill.

[21] Appl. No.: 133,493

[22] Filed: Dec. 14, 1987

[51] Int. Cl.$^4$ .............................................. B05D 1/08
[52] U.S. Cl. .................... 427/34; 156/272.2; 156/273.3; 204/192.11; 204/192.12; 204/192.31; 204/157.44; 228/122; 228/208; 427/37; 427/38; 427/223; 427/225; 427/299; 427/423
[58] Field of Search ...................... 427/34, 37, 38, 223, 427/225, 423, 299; 228/208, 122; 156/272.2, 273.3; 204/157.44, 192.11, 192.12, 192.31

[56] References Cited

U.S. PATENT DOCUMENTS

| | | |
|---|---|---|
| 3,674,586 | 7/1972 | Rimkus . |
| 3,872,577 | 3/1975 | Kugler et al. .................. 228/208 |
| 4,341,816 | 7/1982 | Lauterbach et al. ........... 228/208 |
| 4,457,972 | 7/1984 | Griffith et al. ................. 427/43.1 |
| 4,526,624 | 7/1985 | Tombrello et al. . |

OTHER PUBLICATIONS

"Ion Beam Enhanced Adhesion"-T. A. Tombrello.
"Enhancement of Adhesion by MeV Ion Bombardment"-T. A. Tombrello.
"Ion Beam Enhanced Adhesion in the Electronics Stopping Region"-J. E. Griffith.
"Enhanced Adhesion From High Energy Ion Irradiation"-B. T. Werner et al.

Primary Examiner—Stanley Silverman
Attorney, Agent, or Firm—Wood, Dalton, Phillips, Mason & Rowe

[57] ABSTRACT

A method is provided for improving the adhesion of a substrate material which does not form stable bonds to a bondable material by applying high energy bondable ions to the surface of the substrate to create an interface alloy layer and then adhering a bondable material to the surface of the substrate material. The high energy ions used may be meal ions. Before adhering, the thickness of the interface layer may be increased to form a layer utilizing conventional processes such as flame spray, plasma spray or D-gun spray. Additionally, the method may be used to join similar or dissimilar first and second substrate materials.

20 Claims, 1 Drawing Sheet

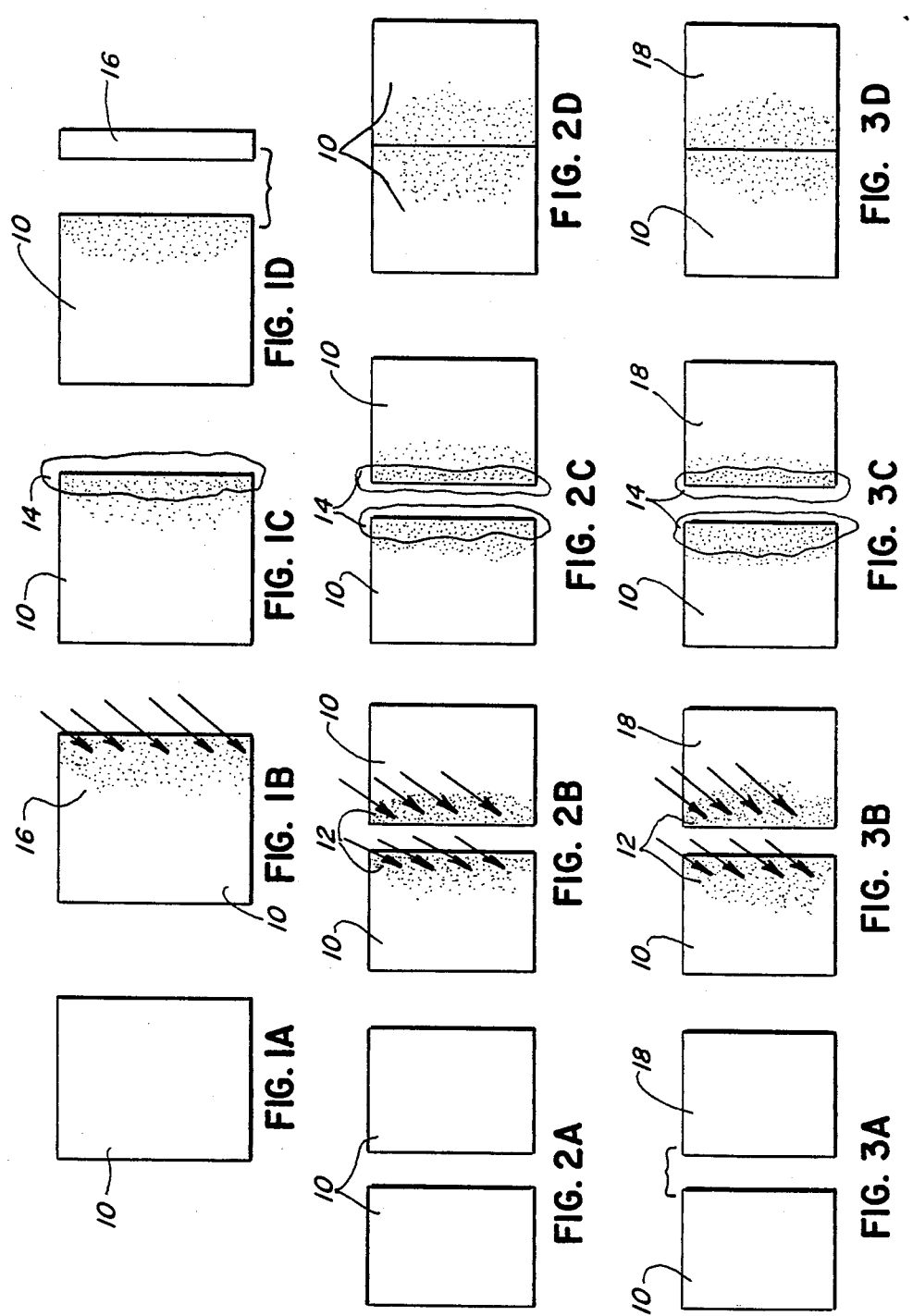

ENHANCED ADHESION OF SUBSTRATE MATERIALS USING ION-BEAM IMPLANTATION

FIELD OF THE INVENTION

This invention generally relates to a method for improving the adhesion of a substrate material to a bondable material or a second substrate material and, more particularly, to a method which includes applying high energy ions to a surface of the substrate material for later adhering to a bondable material or a second substrate material.

BACKGROUND OF THE INVENTION

In many applications, a non-metallic material is used in place of metal to reduce the weight or cost of a component or for providing different properties. These non-metallic materials may be ceramics or composites, such as graphite epoxy. When composites or ceramics are used, problems are introduced which relate to the joining of the non-metallic component to other materials. One particular example of this type of problem relates to the inclusion of a metallic bearing component within a composite or ceramic structure. Another example relates to the fastening of two composite or ceramic structures, such as mating housing components, to each other. A further example is a carbon/graphite seal in a surrounding metal housing.

Present methods of joining a composite or ceramic component have relied on some form of mechanical means, such as fasteners, bolts or rivets, to provide a mechanical bond. However, these types of bonds tend to be weaker than the parent materials and, therefore, are prone to premature fatigue-type failure due to their flexing and delaminating nature.

Some attempts at solving these problems have involved methods of ion-beam implantation. Ion-beam-induced atomic mixing is a well known technique for improving the bonding at an interface between dissimilar materials. It has been widely known that bombarding the interface between two materials with low energy ions in the nuclear stopping region causes the two media to intermix and results in the creation of a molecular bond which is much stronger than the traditional mechanical bond. Such a method of ion-beam implantation is exemplified in U.S. Pat No. 4,457,972 issued July 3, 1984 to Griffith et al, and U.S. Pat. No. 4,526,624 issued July 2, 1985 to Tombrello et al. Both patents disclose a method for improving the adhesion between a metal film and a substrate material wherein the materials are first brought into contact and then high energy ions are applied to the interface between the two surfaces. Such a method has the disadvantage that the two materials must first be brought into contact before the high energy ions may be applied.

There is a need for an improved ion-beam implantation method wherein the high energy ions are applied to the surface of the substrate material for joining with a bondable material or a second substrate material.

SUMMARY OF THE INVENTION

An object, therefore, of the invention is to provide a new and improved method of adhering substrate materials using ion-beam implantation.

In the exemplary embodiment of the invention, a method is provided for improving the adhesion of a substrate material which does not form stable bonds to a bondable material wherein the steps include applying high energy ions to the surface of the substrate material sufficient to improve adhesion and then adhering a bondable material to the surface of the substrate. The method also provides that the high energy ions may be metal ions.

In addition, the method provides that the surface thickness of the ion implanted substrate material may be increased to form a metal layer. The metal layer may be formed utilizing such conventional processes as flame spraying, plasma spraying or D-gun spraying.

Furthermore, the method includes the step of providing a second substrate material which does not form stable bonds with the first substrate, applying high energy ions to a surface of the second substrate to improve adhesion, and then adhering the first substrate material to the second substrate material. The first and second substrate materials may be provided of similar or dissimilar materials.

Other objects and features of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIGS. 1A–D illustrate, in a schematic fashion, one embodiment of the method of the invention;

FIGS. 2A–D illustrate, in a schematic fashion, another embodiment of the method of the invention; and FIGS. 3A–D illustrate, in a schematic fashion, yet another embodiment of the method of the invention.

DETAILED DESCRIPTION OF THE PREFERRED EMBODIMENT

Referring to the drawings in greater detail, and first to FIGS. 1A–1D, there is illustrated a substrate material 10 before ion-beam implantation. The substrate material 10 may be any material, such as a ceramic, which does not form stable bonds to a bondable material 16 such as metal.

FIG. 1B is a schematic illustration of an interface alloy layer 12 which is created using ion-beam implantation, ion-beam mixing or any other variation of this process whereby the substrate material 10 is alloyed with a bondable material 16, via ion bombardment. This process takes ions of a bondable material 16 and accelerates and directs them into the surface of the substrate material 10 thereby causing atoms of the bondable material 16 to displace and form molecular bonds with the atoms of the substrate material 10. As shown in FIG. 1C, the interface alloy layer 12 which has been created on the surface of the substrate material 10 can now be treated as similar to the bondable material 16 to which it was alloyed. As such, it can now have its surface thickness increased to form a layer 14 using conventional processes developed for this purpose such as flame spraying, plasma spraying, D-gun spraying, and the like. As shown in FIG. 1D, the substrate material 10 with interface layer 12 can be adhered to a bondable material 16 either before or after the surface thickness of the interface alloy layer 12 has been increased.

FIGS. 2A-D and 3A-D illustrate a method by which first and second substrate materials may be joined using the ion-beam implantation process of the invention. FIGS. 2A-D illustrate a method of the invention wherein the first and second substrate materials are provided of similar materials. For example, the first and second substrate materials may be similar thermosetting materials such as graphite epoxy or ceramic or composite materials which ordinarily can only be adhered to each other by mechanical means such as fasteners, bolts, rivets or adhesives. The method involves the application of high energy bondable ions to the surface of the similar first and second substrate materials 10, in the manner previously discussed, to create similar interface alloy layers 12. After the interface alloy layer 12 has been formed, the surface thickness of the interface alloy layer 12 on each substrate material 10 may be increased to form a layer 14 using the processes earlier described. Finally, the similar first and second substrate materials 10 now may be adhered to each other as shown in FIG. 2D using conventional processes such as brazing, induction welding or inertia welding. Processes involving the use of a laser or ion beam may be used if there is sufficient access to the joint. It should be noted that the similar first and second substrate materials 10 may also be adhered to each other before the surface thickness of the interface alloy layer 12 has been increased.

FIGS. 3A-D illustrate a method of the present invention wherein the first and second substrate materials are provided of dissimilar materials. For example, the first substrate material 10 may be a ceramic material or a composite material while the second substrate material 18 may be a metal. Again, the method utilized is very much like that described with respect to the joining of similar substrate materials. The only difference being that the ions which are applied to the surface of the first substrate material 10 are ions of the second substrate material 18 or ions compatible with the second substrate material 18 for joining purposes.

It will be understood that the invention may be embodied in other specific forms without departing from the spirit or central characteristics thereof. The present examples and embodiments, therefore, are to be considered in all respects as illustrative and not restrictive and the invention is not to be limited to the details given herein.

We claim:

1. A method of improving the adhesion of a substrate material which does not form stable bonds to a bondable material, comprising the steps of:
   forming an interface layer sufficient to improve adhesion on a surface of a substrate material by the bombardment of high energy bondable ions into the surface of the substrate material; and
   adhering the bondable material to the interface layer formed on the surface of the substrate.

2. The method of claim 1 wherein the high energy bondable ions are metal ions.

3. The method of claim 2 wherein the thickness of the interface layer formed on the substrate surface is increased to form a metal layer thereon.

4. The method of claim 3 wherein the metal layer is formed using a flame spraying process.

5. The method of claim 3 wherein the metal layer is formed using a plasma spraying process.

6. The method of claim 3 wherein the metal layer is formed using a D-gun spraying process.

7. The method of claim 1, further including the steps of providing a second substrate material which does not form stable bonds with the first substrate, forming an interface layer sufficient to improve adhesion on a surface of the substrate material by the bombardment of high energy bondable ions into the surface of the second substrate material, and adhering the first substrate material to the second substrate material.

8. The method of claim 7 wherein said first and second substrate materials are provided of similar materials.

9. The method of claim 7 wherein said first and second substrate materials are provided of dissimilar materials 10. The method of claim 9 wherein the high energy ions bombarded into the surface of said first substrate material are ions of said second substrate.

11. The method of claim 9 wherein the high energy ions bombarded into the surface of said first substrate material are ions compatible with the second substrate material for joining purposes.

12. A method of improving the adhesion of a substrate material which does not form stable bonds to a bondable material, comprising the steps of:
   forming an interface layer sufficient to improve adhesion on a surface of the substrate material by the bombardment of high energy bondable ions into the surface of the substrate material;
   increasing the thickness of the interface layer formed on the substrate surface to form a bondable layer thereon; and
   adhering the bondable material to the interface layer formed on the surface of the substrate.

13. The method of claim 12 wherein the bondable layer is formed using a flame spraying process.

14. The method of claim 12 wherein the bondable layer is formed using a plasma spraying process.

15. The method of claim 12 wherein the bondable layer is formed using a D-gun spraying process.

16. The method of claim 12, further including the steps of providing a second substrate material which does not form stable bonds with the first substrate, forming an interface layer sufficient to improve adhesion on a surface of the substrate material by bombarding high energy bondable ions into the surface of the second substrate material, and adhering the first substrate material to the second substrate material.

17. The method of claim 16 wherein said first and second substrate materials are provided of similar materials.

18. The method of claim 16 wherein said first and second substrate materials are provided of dissimilar materials.

19. The method of claim 18 wherein the high energy ions bombarded into the surface of said first substrate material are ions of said second substrate material.

20. The method of claim 18 wherein the high energy ions bombarded into the surface of said first substrate material are ions compatible with the second substrate material for joining purposes.

* * * * *